(12) United States Patent
Sunaga (10) Patent No.: US 6,754,134 B1
(45) Date of Patent: Jun. 22, 2004

(54) SEMICONDUCTOR STORAGE DEVICE HAVING MULTIPLE INTERRUPT FEATURE FOR CONTINUOUS BURST READ AND WRITE OPERATION (75) Inventor: Toshio Sunaga, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,370

(22) Filed: Sep. 25, 2003

(51) Int. Cl.[7] ................................................. G11C 8/00
(52) U.S. Cl. .................................. 365/233; 365/230.03
(58) Field of Search ............................. 365/233, 230.03

(56) References Cited

U.S. PATENT DOCUMENTS 6,252,794 B1 * 6/2001 Sunaga et al. .............. 365/233
6,269,048 B1 * 7/2001 Kano et al. ................. 365/233
6,414,902 B2 * 7/2002 Morgan et al. ............. 365/233
6,646,955 B2 * 11/2003 Toda ........................... 365/233

* cited by examiner

Primary Examiner—Trong Phan
(74) Attorney, Agent, or Firm—Anthony J. Canale (57) ABSTRACT The present invention relates to a semiconductor storage device capable of performing seamless input/output of data when an interrupt is inserted during a burst operation. A plurality of segment arrays activated independently from each other are provided. Each segment array includes a plurality of unit arrays activated independently from each other. Each segment array is provided with prefetch latch circuits for latching burst read data and preload latch circuits for latching burst write data. When an interrupt occurs during a burst operation of a a first unit array in a first segment array, a second unit array in a second activated segment array initiates a burst operation.

9 Claims, 12 Drawing Sheets

SEMICONDUCTOR STORAGE DEVICE HAVING MULTIPLE INTERRUPT FEATURE FOR CONTINUOUS BURST READ AND WRITE OPERATION

BACKGROUND OF INVENTION

1. Field of the Invention

The present invention relates to a semiconductor storage device and, more particularly, to a semiconductor storage device having a multiple burst interrupt feature for switching burst operations on a priority basis.

2. Background of the Invention

Figure 11:
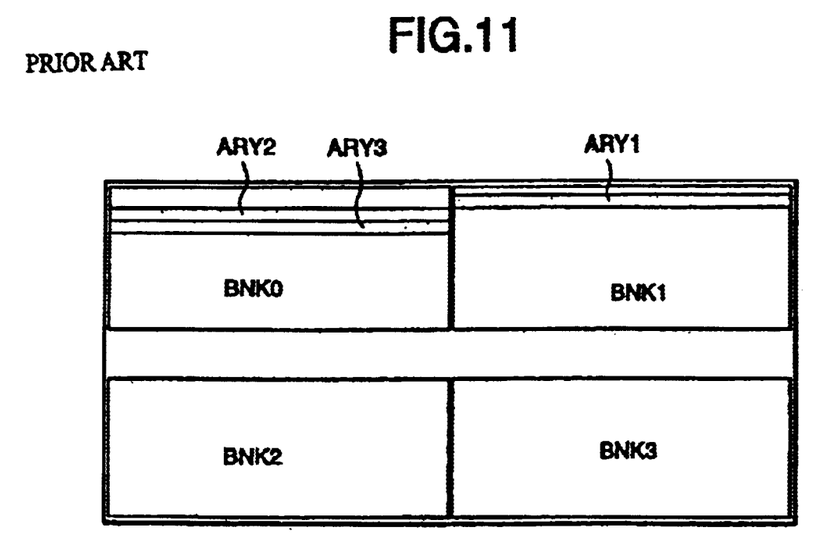
FIG. 11 is a layout diagram showing the entire configuration of a conventional prior art SDRAM.

FIG. 11 shows the layout of the entire configuration of a conventional DDR (Double Data Rate) type SDRAM (Synchronous Dynamic Random Access Memory). Referring to FIG. 11, the SDRAM shown includes four banks, BNK0 through BNK3, utilizes a 16-bit data bus for input and output of data and has a memory capacity of 256 Mbits.

Each bank BNKi (i=0 to 3) has 8K word lines (not shown), 8K pairs of bit lines (not shown) and 8K sense amplifiers (not shown), and has a memory capacity of 64 Mbits. Each bank BNKi inputs and outputs 16-bit data.

Each bank BNKi is divided into 16 arrays. FIG. 11 representatively illustrates arrays ARY2 and ARY3 of the bank BNK0 and an array ARY1 of the bank BNK1. Each array has 512 word lines, 8K pairs of bit lines and 8K sense amplifiers, and has a memory capacity of 4 Mbits. Each array inputs and outputs 16-bit data.

The SDRAM has a burst interrupt feature for interrupting a burst operation to start another burst operation. The burst interrupt feature will be explained, referring to the timing chart shown in FIG. 12. A burst read operation is shown with a CAS (Column Address Strobe) latency set to 2 clock cycles and a burst length of 8 bts. Since this SDRAM is the DDR type, it is capable of substituting 8-bit burst data by another 8-bit burst data storing at an odd position of the burst data. Specifically, burst data after the 3rd bit, 5th bit or 7th bit can be replaced by another burst data.

Figure 12:
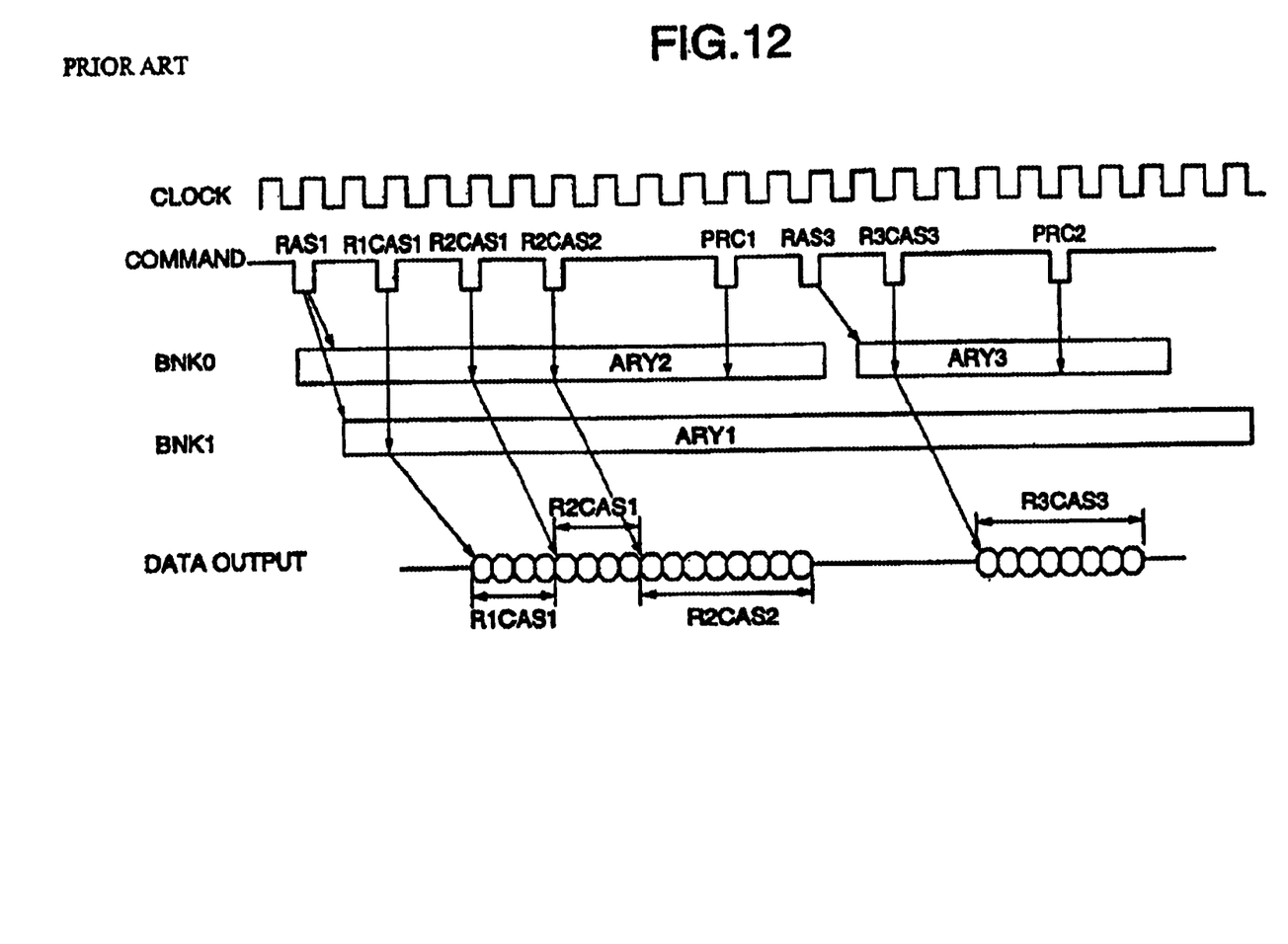
FIG. 12 is a timing chart showing a burst read operation of the conventional prior art SDRAM shown in FIG. 11.

First, a command RAS1 is issued. The command RAS1 means inputting a row address in response to a RAS (Row Address Strobe). In response to the row address input by the command RAS1, a bank BNK1 is activated, and an array ARY1 in the bank BNK1 is activated. In this case, by the time the array ARY1 in the bank BNK1 is activated, the bank BNK0 has already been activated and an array ARY2 in the bank BNK0 has been activated.

Subsequently, a command R1CAS1 is issued. The command R1CAS1 means inputting a column address in response to a CAS. A burst read operation starts following two clocks from the command R1CAS1. Specifically, in an array ARY1 in the activated bank BNK1, data is consecutively read, beginning with the column address input by the command R1CAS1.

Subsequently, when a command R2CAS1 is issued following two clock cycles from the command R1CAS1, another burst read operation begins following two clock cycles from the command R2CAS1. Specifically, in an array ARY2 in another bank BNK0, data is consecutively read, beginning with the column address input by the command R2CAS1.

At this time, the burst read operation started in response to the command R1CAS1 is interrupted by the burst read operation started in response to the command R2CAS1. Specifically, the burst read operation begun in response to the command R1CAS1 is interrupted after the data of a 4th bit is read, and the data of a 5th bit and after is replaced by the data read by the burst read operation begun in response to the command R2CAS1.

Next, when a command R2CAS2 is issued, following two clock cycles from the command R2CAS1, another burst read operation begins following two clock cycles from the command R2CAS2. Specifically, in array ARY2 in the same bank BNK0, data is consecutively read, beginning with another column address input by the command R2CAS2.

At this time, the burst read operation started in response to the command R2CAS1 is interrupted by the burst read operation started in response to the command R2CAS2. Specifically, the burst read operation begun in response to the command R2CAS1 is interrupted after the data of the 4th bit is read, and the data of the 5th bit and after is replaced by the 8-bit data read by the burst read operation begun in response to the command R2CAS2.

Thus, even when a burst read operation is interrupted, the conventional SDRAM is capable of seamlessly outputting data if a new address input by the interruption is either a column address in another bank already activated or another column address currently being activated in the same array in the same bank. If, however, the new address is a column address other than the above, then seamless output of data cannot be realized.

For example, if an address is changed from array ARY2 to another array ARY3 even in the same bank BNK0, the array ARY2 must be first pre-charged to be activated in response to the command PRC1, then array ARY3 must be activated in response to a command RAS3. In this case, an 8-bit burst read operation begins only after two clocks following a command R3CAS3. This causes a gap equivalent to 8 bts to be produced in burst data to be output, resulting in a lower data rate.

The burst read operation interrupt occurs when priority is assigned to a computer program other than the currently executing computer program. In this case, a new address input for the interrupt is seldom a column address in the same row address. Therefore, the burst interrupt feature provided in the conventional SDRAM can rarely be utilized effectively.

In the case of the SDRAM shown in FIG. 11, if one of the sixteen arrays is selected and one word line in the selected array is activated, then 8K sense amplifiers are activated. Since the SDRAM has sixteen inputs/outputs, the page length per input/output is 512 (=8K÷16) bits. In other words, there are only 512 addresses allowing seamless interrupt to be handled. Even if all four banks BNK0 to BNK3 are activated, there are only 2K (=512×4) addresses permitting seamless interrupt to be accomplished. This number is extremely limited for the total number of addresses 16M (=256M÷16) per input/output. The probability of successful seamless interrupts depends on the address space ratio (2K/16M), and is only 0.012%. This means that 99.998% of burst operation interrupt requests cannot be seamlessly handled. In most cases, therefore, a gap occurs in burst data to be output, resulting in a lower data rate.

Japanese Unexamined Patent Application Publication No. 2000-195253 (U.S. Pat. No. 6,252,794) has disclosed an SDRAM adapted to shorten a gap between burst operations by activating only the quantity of sense amplifiers corresponding to a burst length. The application, however, does not at all refer to a burst operation interrupt.

In the above description, the problems with the burst interrupt feature have been explained, taking the burst read operation as an example. The same problems are observed, however, also with a burst write operation.

SUMMARY OF INVENTION

An object of the present invention is to provide a semiconductor storage device permitting seamless input/output of data even when an interrupt takes place during a burst operation.

Another object of the present invention is to provide a semiconductor storage device having a higher probability of a valid interrupt for switching, on a priority basis, to a second burst operation while processing a first burst operation.

A semiconductor storage device according to one aspect of the present invention has a plurality of arrays, a plurality of burst read circuits, and a burst interrupt circuit. The plurality of arrays are activated independently from each other. The plurality of burst read circuits are provided, corresponding to the plurality of arrays. Each of the burst read circuits successively reads a plurality of bits of data from its corresponding array. The burst interrupt circuit activates a first burst read circuit while a second burst read circuit is activated.

In the semiconductor storage device, the arrays are activated independently from one another. Hence, an interrupt can be accepted while a plurality of bits of data is being successively read from one activated array, and a plurality of bits of data can be successively read from another activated array. This arrangement permits seamless output of burst data.

Preferably, the semiconductor storage device further includes a plurality of burst write circuits. The plurality of burst write circuits is provided, corresponding to the plurality of arrays. Each of the burst write circuits successively writes a plurality of bits of data to its corresponding array.

In this case, an interrupt is asserted while a plurality of bits of data is being successively written to one activated array, and a plurality of bits of data can be successively written to another activated array. Thus, seamless output of burst data is realizable.

A semiconductor storage device according to another aspect of the present invention includes a plurality of segment arrays, a plurality of segment selector circuits, a plurality of unit array selector circuits, a plurality of burst read circuits and a burst interrupt circuit. Each of the segment arrays includes a plurality of unit arrays. The plurality of segment selector circuits are provided, corresponding to the plurality of segment arrays. Each of the segment selector circuits activates its corresponding segment array. The plurality of unit array selector circuits are provided, corresponding to the plurality of segment arrays. Each of the unit array selector circuits selectively activates the plurality of unit arrays included in its corresponding segment array. The plurality of burst read circuits are provided, corresponding to the plurality of segment arrays. Each of the burst read circuits successively reads a plurality of bits of data from the unit array activated by a unit array selector circuit among the plurality of unit arrays included in its corresponding segment array. While at least one burst read circuit among the plurality of burst read circuits is being activated, the burst interrupt circuit activates another burst read circuit.

In the semiconductor storage device, the segment arrays are activated independently from one another. Hence, an interrupt can be accepted while a plurality of bits of data is being successively read from a unit array in one activated segment array, and a plurality of bits of data can be successively read from another activated segment array. This arrangement permits seamless output of burst data.

Preferably, each of the burst read circuits further includes a first prefetch latch circuit. The first prefetch latch circuit is activated in response to a first read enable signal, and latches a plurality of bits of data read from a unit array activated by a unit array selector circuit. The burst interrupt circuit activates the first read enable signal for the first prefetch latch circuit corresponding to the segment array activated by a segment selector circuit.

Further, each of the burst read circuits preferably includes a second prefetch latch circuit. The second prefetch latch circuit is activated in response to a second read enable signal, and latches a plurality of bits of data read from another unit array activated by a unit array selector circuit. The burst interrupt circuit activates the second read enable signal for the second prefetch latch circuit corresponding to the segment array activated by a segment selector circuit.

In this case, the plurality of bits of data read from one activated unit array is latched by the first prefetch latch circuit, and the plurality of bits of data read from another activated unit array is latched by the second prefetch latch circuit. This arrangement allows a burst reading interrupt to be accepted between unit arrays in a single segment array.

Preferably, the semiconductor storage device further includes a plurality of burst write circuits. The plurality of burst write circuits is provided, corresponding to the plurality of segment arrays. Each of the burst write circuits successively writes a plurality of bits of data to its corresponding segment array.

In this case, an interrupt is inserted while a plurality of bits of data is being successively written to one activated unit array, and a plurality of bits of data can be successively written to another activated unit array. Thus, seamless output of burst data is realized.

Additionally, each of the burst write circuits preferably includes a first preload latch circuit. The first preload latch circuit is activated in response to a first write enable signal, and latches a plurality of bits of data to be written to a unit array activated by a unit array selector circuit. The burst interrupt circuit activates the first write enable signal for the first preload latch circuit corresponding to the segment array activated by a segment selector circuit.

Further, each of the burst write circuits preferably includes a masking device for partly masking the plurality of bits of data latched by the first preload latch circuit.

In this case, an interrupt is inserted during a first burst write to a unit array, and the data latched by the first preload latch circuit after the interrupt is the data to be written to another unit array, causing the data to be masked by the masking device so as not to be written to the first unit array.

Preferably, each of the burst write circuits further includes a second preload latch circuit. The second preload latch circuit is activated in response to a second write enable signal, and latches a plurality of bits of data to be written to another unit array activated by a unit array selector circuit. The burst interrupt circuit activates the second write enable signal for the second preload latch circuit corresponding to the segment array activated by a segment selector circuit.

In this case, the plurality of bits of data written to one activated unit array is latched by the first preload latch circuit, and the plurality of bits of data written to another activated unit array is latched by the second preload latch circuit. This arrangement allows a burst writing interrupt to be accepted between unit arrays in a single segment array.

DETAILED DESCRIPTION

An embodiment of the present invention will be explained in detail, referring to the accompanying drawings. The same or equivalent components in the drawings will be assigned the same reference numerals, and the descriptions thereof will be shared.

Figure 1:
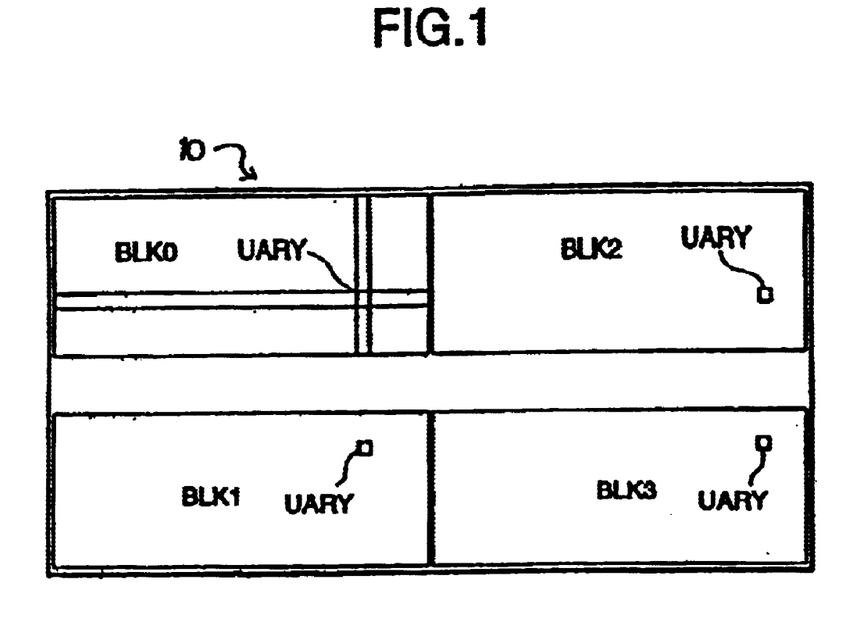
FIG. 1 is a layout diagram showing an entire configuration of a DDR-SDRAM according to a first embodiment of the present invention.

Referring to FIG. 1, a DDR-SDRAM 10 according to a first embodiment of the present invention includes four blocks BLK0 through BLK3. Each block BLKi (i=0 to 3) has a storage capacity of 64 Mbits and includes a unit array (UARY).

Four input/output pads (IO in FIG. 3) are provided for the blocks BLKi. Hence, the entire SDRAM has sixteen input/output pads in total. Each block BLKi inputs or outputs 4-bit data through the corresponding pad among the four input/output pads. Thus, the entire SDRAM inputs and outputs data through a 16-bit bus.

Figure 2:
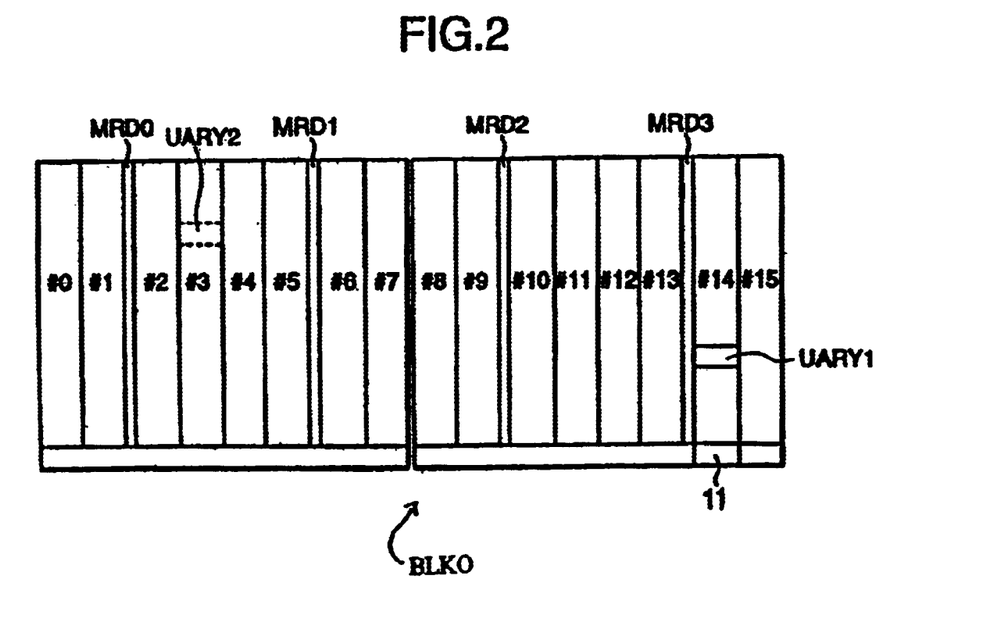
FIG. 2 is a layout diagram showing the configuration of each block shown in FIG. 1.

FIG. 2 is a layout diagram showing the configuration of the block BLK0. The remaining blocks BLK1 through BLK3 share the same basic configuration; therefore, the descriptions will be given of the configuration of the block BLK0 representing all blocks.

Referring to FIG. 2, the block BLK0 includes sixteen segment arrays #0 through #15 and four main row decoders (MRD), MRD0 through MRD3.

MRD0 is disposed between the segment arrays #1 and #2, and shared among the four segment arrays #0 through #3. MRD1 is disposed between the segment arrays #5 and #6, and shared among the four segment arrays #4 through #7. MRD2 is disposed between the segment arrays #9 and #10, and shared among the four segment arrays #8 through #11. MRD3 is disposed between the segment arrays #13 and #14, and shared among the four segment arrays #12 through #15.

The block BLK0 further includes sixteen segment control circuits corresponding to the sixteen segment arrays #0 through #15. FIG. 2 shows a segment control circuit 11 corresponding to the segment array #14. Each segment control circuit controls its corresponding segment array.

Figure 3:
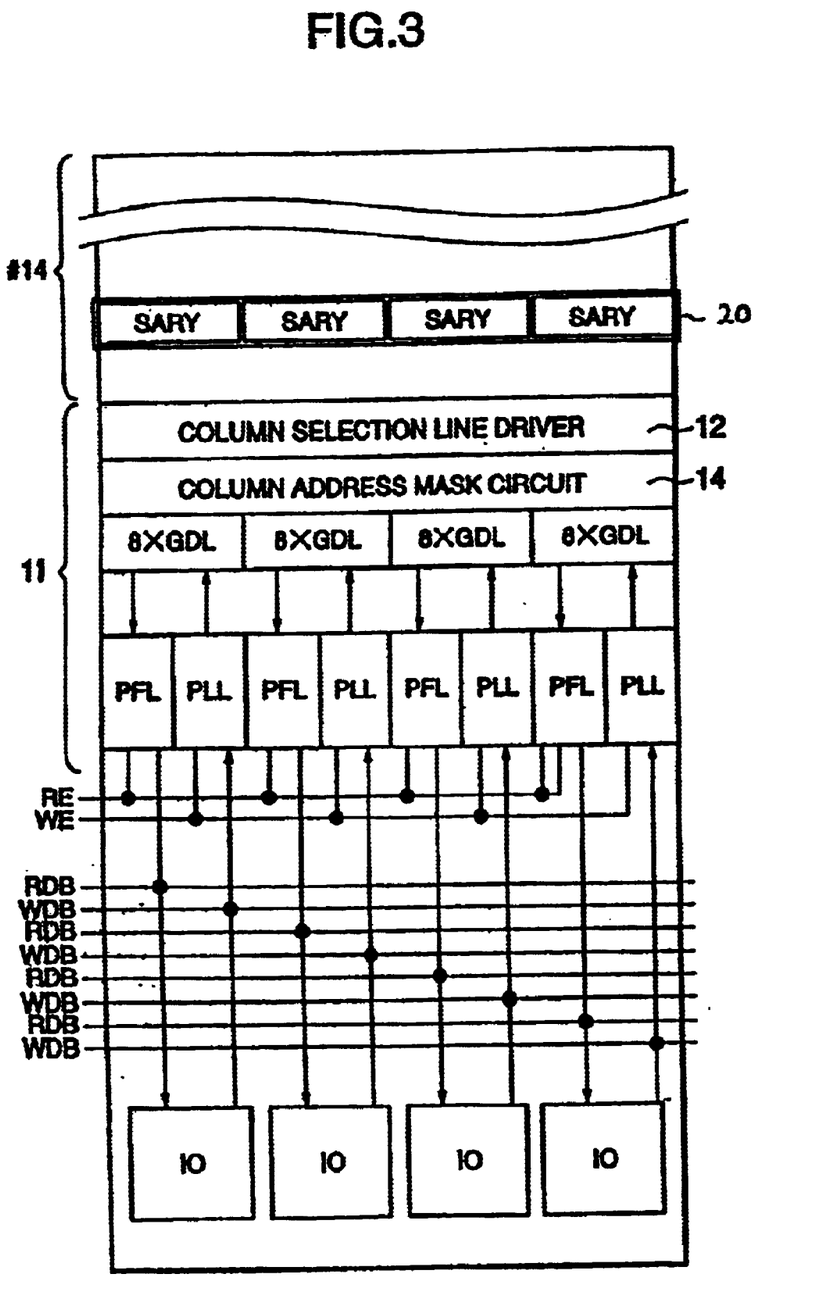
FIG. 3 is a functional block diagram showing the configurations of each segment array, a segment control circuit and its peripheral components shown in FIG. 2.

FIG. 3 is a functional block diagram illustrating the configurations of the segment array #14 and the segment control circuit 11. The following representatively explains the configurations of the segment array #14 and the segment control circuit 11.

Referring to FIG. 3, the segment array #14 includes sixteen unit arrays. A single unit array (UARY1) 20 is shown in FIG. 3. Each UARY 20 has a 256-Kbit storage capacity and is divided into four sub-arrays (SARY).

The segment control circuit 11 includes a column selection line driver 12, a column address mask circuit 14, 32 (=8×4) global data line (GDL) pairs, four prefetch latch circuits (PFL) and four preload latch circuits (PLL). Eight GDL pairs are provided, corresponding to the sub-arrays SARYs. Each PFL latches 8-bit data read from its corresponding SARY through the eight GDL pairs in response to a read enable signal RE. Each PLL latches 8-bit data to be written to its corresponding SARY through the eight GDL pairs in response to a write enable (WE) signal.

The block BLK0 including the segment array #14 further provides four read data buses (RDBs) shared among the sixteen segment arrays #0 through #15, four write data buses (WDBs) shared among the sixteen segment arrays #0 through #15 and four input/output (IO) pads.

The four PFLs in each segment control circuit 11 are connected to the four read data buses, respectively. The four PLLs in each segment control circuit 11 are connected to the four write data buses, respectively. Each IO pad is connected to its corresponding read data bus and its corresponding write data bus.

Each read data bus transmits the read data supplied from its corresponding PFL to its corresponding input/output IO pad by two bits. Each write data bus transmits the write data supplied from its corresponding IO pad, to its corresponding PLL by two bits.

Figure 4:
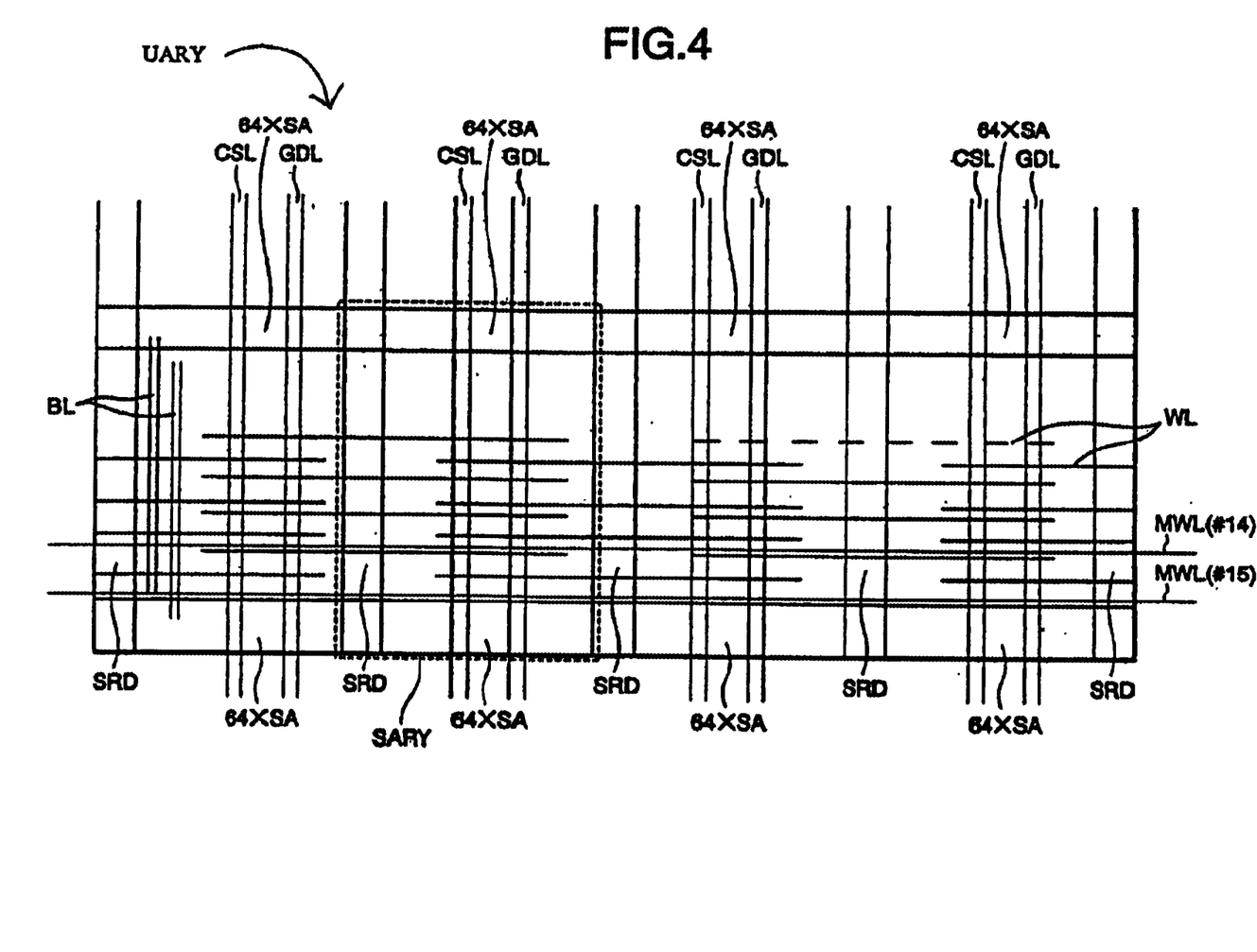
FIG. 4 is a layout diagram showing the configuration of each unit array shown in FIG. 3.

FIG. 4 is a layout diagram showing the configuration of each UARY 20. Referring to FIG. 4, each UARY 20 has a so-called hierarchical word line configuration.

Specifically, each SARY includes 512 segment word lines (WL) disposed in lines and 64 segment row decoders (SRD). Each SRD is provided for eight segment word lines, and selectively drives the corresponding segment word lines. The segment word lines constitute the gate electrode of a memory cell transistor (not shown).

Each SARY further includes 128 bit line pairs arranged in columns and 128 sense amplifiers connected to the bit line pairs. The 128 sense amplifiers are disposed on both sides of the bit line pairs, 64 each. Thus, the entire UARY 20 includes 512 bit line pairs and 512 sense amplifiers. The bit line pairs are formed in accordance with the segment word lines.

Across the UARY 20 lie 128 main word lines (MWL), 64 main word lines (#14) of which are connected to the SRD of the UARY 20, while the remaining 64 main word lines (#15) are connected to the SRD of the unit array in an adjacent segment array #15. The main word lines extend from both sides of the main row decoder MRD3, cross the segment arrays #14 and #15 on the right side in the drawing and also cross the segment arrays #13 and #12 on the left side in the drawing. The main row decoder MRD3 selectively drives the main word lines in the segment arrays #12 to #15 in response to row address signals. The MWLs are formed in a first metal layer above the layer of the segment word lines.

Each SARY has 64 column selection lines (CSL) longitudinally arranged. Hence, the entire UARY 20 has 256 CSLs longitudinally arranged and connected to the column selection line driver 12. The column selection line driver 12 selectively drives the 256 CSLs in response to column address signals. The CSLs are formed in a second metal layer above the first metal layer.

Each SARY further has eight GDL pairs longitudinally arranged. Hence, the entire UARY 20 has 32 GDL pairs longitudinally arranged. The eight GDL pairs longitudinally arranged in each SARY are connected to their corresponding PFLs and PLLs. The GDL pairs are also formed in the second metal layer.

Figure 5:
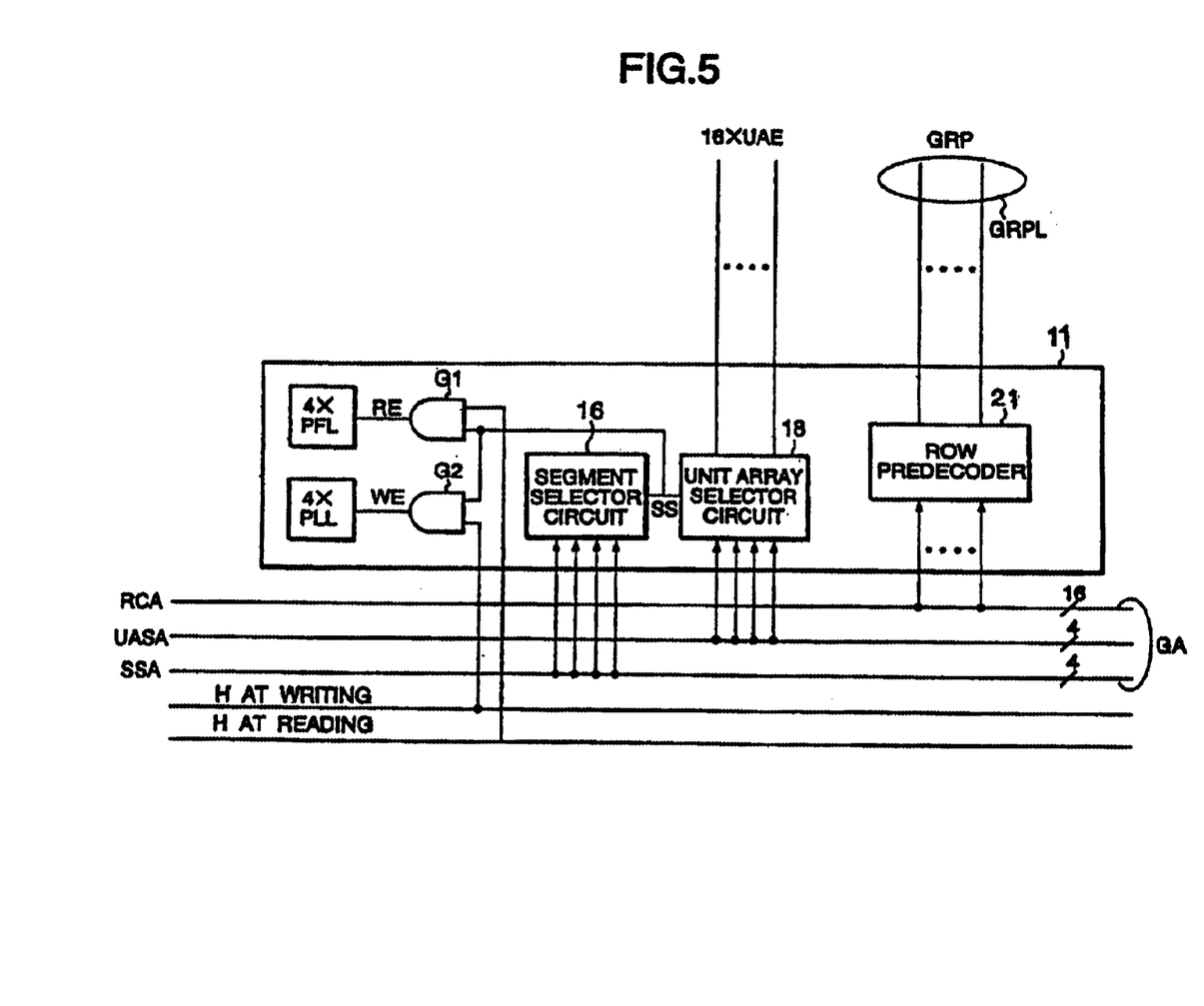
FIG. 5 is a functional block diagram showing the configuration of the segment control circuit shown in FIG. 2.

FIG. 5 is a functional block diagram showing the configuration of the segment control circuit 11. Referring to FIG. 5, the segment control circuit 11 includes a segment selection circuit 16, a unit array selection circuit 18, a row predecoder 21, and AND gates G1 and G2 in addition to the prefetch latch circuits and the preload latch circuits described above.

The SDRAM has 16 Mbits×16 to receive a global address (GA) signal of 24 ($16M=2^{24}$) bits. The GA signal includes a 4-bit segment selection address signal (SSA), a 4-bit unit array selection address signal (UASA) and a 16-bit row/column address (RCA) signal.

The SSA is for selecting one of the sixteen segment arrays #0 to #15. The UASA is for selecting one of the 16 UARYs 20 in the selected one segment array. The row/column address signal is for selecting a row and a column of the selected UARY 20.

The segment selection circuit 16 activates a segment selection (SS) signal to a logic high in response to the segment selection address (SSA) signal. The SS signal is supplied to the AND gates G1 and G2 and the unit array selection circuit 18. When the SS signal is activated, the read enable (RE) signal is activated to a logic high at reading and applied to the PFL, while the write enable (WE) signal is activated to a logic high at writing and applied to the PLL.

When the SS signal is activated, the unit array selection circuit 18 is activated. When activated, the unit array selection circuit 18 activates one of the sixteen unit array enable signals (UAE) in response to a UASA signal.

The row predecoder 21 predecodes a row address signal included in the row/column address signal RCA and outputs the global row predecode (GRP) signal. The GRP signal is supplied to a plurality of global row predecode lines (GRPL) longitudinally crossing all UARYs 20 in the segment array #14.

Figure 6:
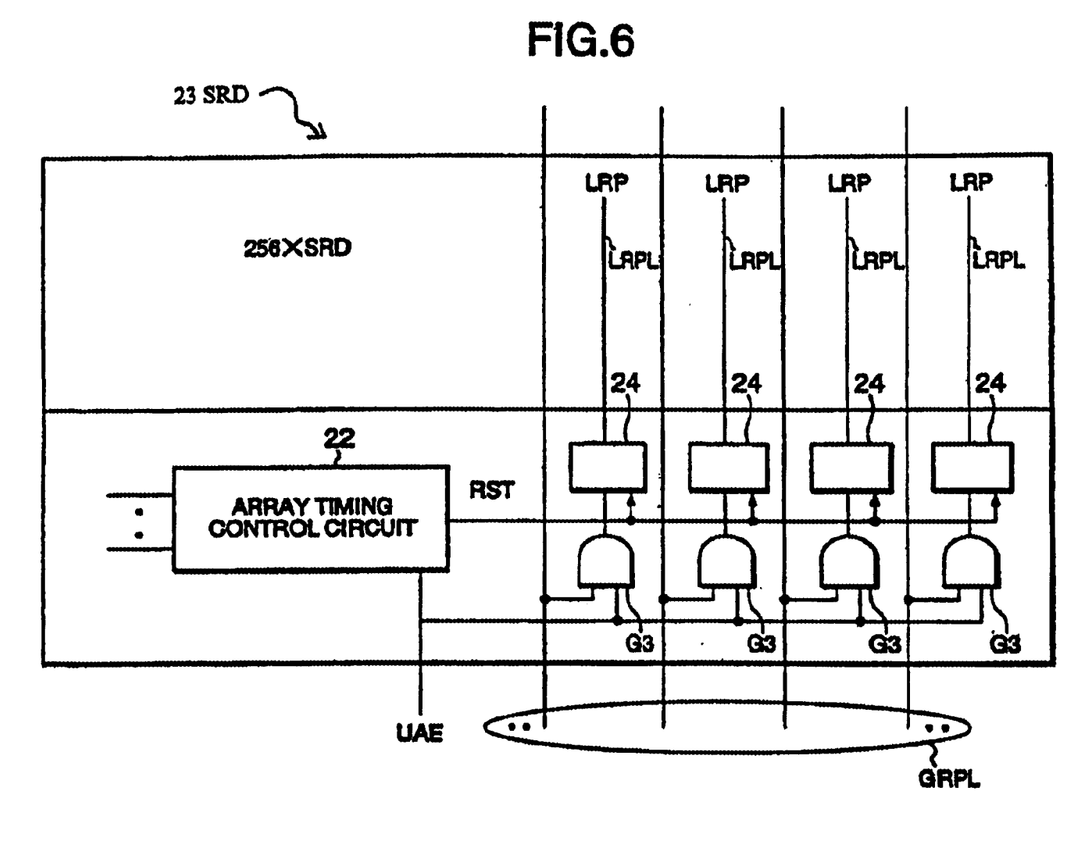
FIG. 6 is a functional block diagram showing the configuration of the neighborhood of a segment row decoder in a unit array shown in FIG. 4.

FIG. 6 is a functional block diagram showing the configuration of the SRD 23 layout in each UARY 20. Referring to FIG. 6, each UARY 20 includes an array timing control circuit 22, a plurality of AND gates G3, a plurality of latching circuits 24 and a plurality of local row predecode lines (LRPL) in addition to the 256 SRDs described above.

The array timing control circuit 22 is activated when its corresponding unit array enable (UAE) signal is activated to a logic high, and controls the operation of the UARY 20. The AND gate G3 supplies the GRP signal to the latching circuit 24 when its corresponding UAE signal is activated to a logic high. The latching circuit 24 latches the GRP signal and supplies it as a local row predecode (LRP) signal to a local row predecode line (LRPL). The LRPL is connected to the SRD 23 in the UARY 20. Hence, the SRD 23 selectively activates the segment word lines in response to the LRP signal.

Referring now to the timing chart of FIG. 7, the burst read operation of the SDRAM having the aforesaid configuration will be described.

First, a command R1A1 is issued, and a global address signal is input. The GA signal input in response to the command R1A1 includes a segment array address signal for selecting the segment array #14, a UASA signal for selecting the unit array UARY1 (see FIG. 2) in the segment array #14, and a RCA signal for selecting a row and a column in UARY1.

The SS circuit 16 activates the SS signal to a logic high in response to the SSA signal. When the SS signal is asserted high, the unit array selection circuit 18 enables the UAE signal for activating the UARY1 to a logic high in response to the UASA signal. When the SS signal is asserted high, the read enable signal output from the AND gate G1 is activated to a logic high at reading. When the read enable signal is set, eight PFLs in the segment control circuit 11 are activated.

The row address signal included in the row column address signal is predecoded by the row predecoder 21 to generate a global row predecode signal. The GRP signal is supplied to the global row predecode line.

In UARY1, the array timing control circuit 22 is activated in response to the UAE signal, and the GRP signal is latched by the latching circuit 24. The latched GRP signal is supplied as a local row predecode signal to the SRD 23, thereby selectively activating the segment word lines.

Subsequently, in UARY1, all sense amplifiers are activated, and 32 column selection lines from among all column selection lines are activated. In other words, eight column selection lines are activated for each SARY. Thus, the 8-bit data simultaneously read from individual SARYs is transmitted to one corresponding PFL via eight GDL pairs and latched. Thus, 32 bits of data are simultaneously read from the entire UARY1 formed of four SARYs, and latched by four PFLs.

The data begins to be transmitted by two bits from each PFL via the read data bus (RDB), and 8-bit burst data begins to be output from a corresponding IO pad.

As described above, the GRP signals are latched by the latching circuits 24 in the UARY1, so that UARY1 is isolated from the global address signals and can therefore be operated independently from the remaining unit arrays. UARY1 operates independently from the remaining unit arrays, so that the array timing control circuit 22 controls in a self-contained manner a series of the operations for activating the word lines and the sense amplifiers, rewriting memory cell data, deactivating the word lines and pre-charging the bit line pairs.

Upon completion of the pre-charging of the bit line pairs, the array timing control circuit 22 supplies a reset signal (RST) to the latching circuits 24. This cancels the isolation from the global address signal and the unit array enable signal is reactivated, causing UARY1 to be selected again.

As described above, UARY1 operates independently from the remaining unit arrays, so that the next global address signal can be supplied before UARY1 completes its operation.

When a command R2A1 is issued following two clocks from a command R1A1, a UARY2 (see FIG. 2) of another segment array #3 is selected in response to the command R2A1. UARY2 operates behind UARY1 by two clock cycles. The UARY1 and UARY2 operate independently from each other.

The unit array UARY2 operates in the same manner as the unit array UARY1, and therefore, 8-bit burst data begins to be output also from the unit array UARY2. If the segment array #3 including the unit array UARY2 is selected, then the read enable (RE) signal of the segment array #14 is deactivated. This deactivates the PFL of the segment array #14, and the burst data from the fifth bit and after will not be output from the unit array UARY1. Instead, burst data is output from the unit array UARY2.

The unit array UARY1 completes its operation in two clock cycles following the command R2A1, but restarts its operation in response to the command R1A2. Hence, the burst read operation started in response to the command R2A1 is suspended by an interrupt after the data of the fourth bit is output. Instead, the burst read operation is begun in response to the command R1A2.

Upon receipt of a command R1A3 in four clock cycles following the input of the command R1A2, the unit array UARY1 restarts the operation after completing the burst operation initiated by R1A2. Hence, following the output of 8-bit burst data based on the command R1A2, 8-bit burst data based on the command R1A3 is immediately output.

Figure 8:
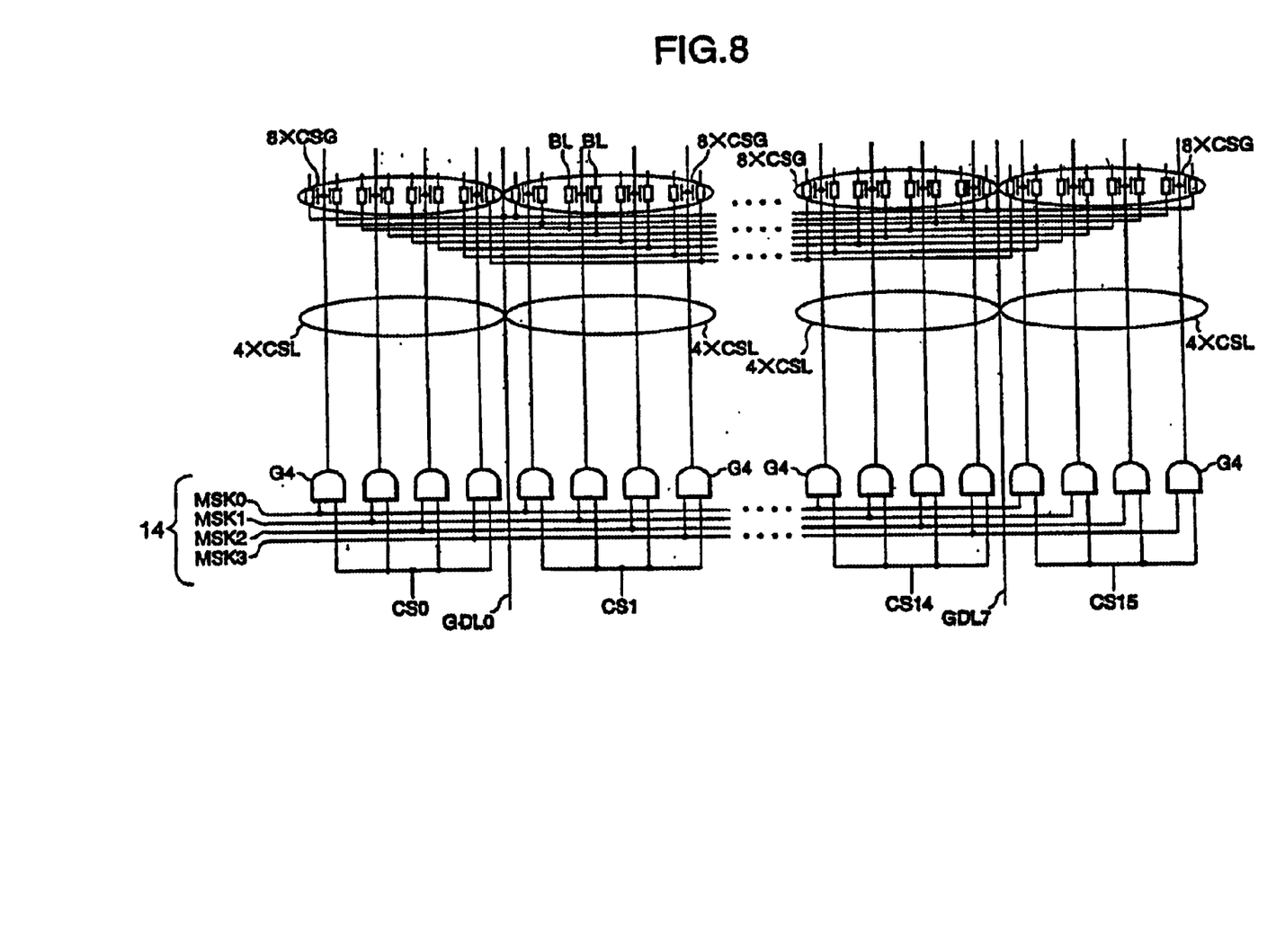
FIG. 8 is a circuit diagram partly showing the configuration of a column address mask circuit and its neighborhood shown in FIG. 3.

FIG. 8 is a circuit diagram partly showing the configurations of a column address mask circuit 14 and associated layout. FIG. 8 shows only the portion corresponding to a single SARY. Although each of bit line pairs and GDL pairs, GDL0 through GDL7, is formed of two lines, it is indicated in a single line. Likewise, each bit switch column selection gate (CSG) is formed of a pair including two bit switches, however, it is shown as a single transfer gate.

Each SARY includes 128 bit switches CSG corresponding to 128 bit line pairs. Since this SDRAM is the DDR type, one column selection line is provided for two bit switches CSG. Thus, four column selection lines are provided for eight bits switches CSG. As shown in FIG. 4, therefore, 64 (=4×16) column selection lines are longitudinally arranged and eight GDL pairs, GDL0 through GDL7, are also longitudinally arranged in each SARY.

The column address mask circuit 14 includes a plurality of AND gates G4 corresponding to a plurality of column selection lines. The entire UARY 20 has 256 column selection lines, so that the entire column address mask circuit 14 includes 256 AND gates G4.

Each sub-array receives 16-bit column selection signals CS0 through CS15. The column selection signals CS0 through CS15 are generated by the column selection line driver 12. Each of the column selection signals CS0 through CS15 is supplied to four corresponding AND gates G4. Masking signals MSK0 through MSK3 are supplied to the four AND gates G4, respectively. The masking signals MSK0 through MSK3 are all set to a logic high level at burst reading. Meanwhile, if an interrupt is inserted at the third bit during an 8-bit data burst write cycle, then the masking signal MSK0 is set to a logic high, whereas the masking signals MSK1 through MSK3 are set to a logic low. If an interrupt is received at the fifth bit, then the masking signals MSK0 and MSK1 are set to a logic high, whereas the masking signals MSK2 and MSK3 are set to a logic low. If an interrupt is received at the seventh bit, then the masking signals MSK0 through MSK2 are set to a logic high, whereas the masking signal MSK3 is set to a logic low.

Referring now to the timing chart of FIG. 9, the burst write operation of the SDRAM will be described.

Figure 7:
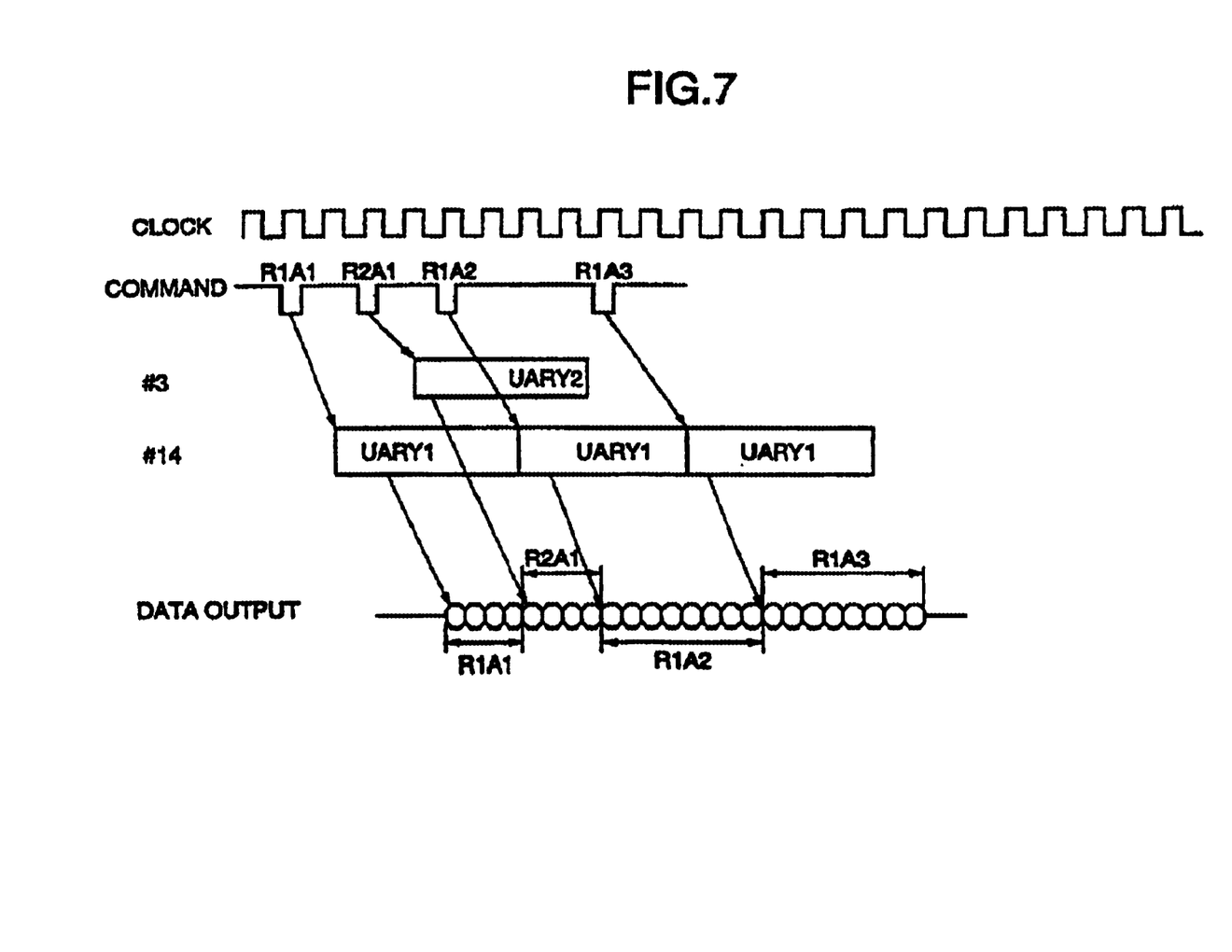
FIG. 7 is a timing chart showing a burst read operation of the SDRAM shown in FIG. 1.
Figure 9:
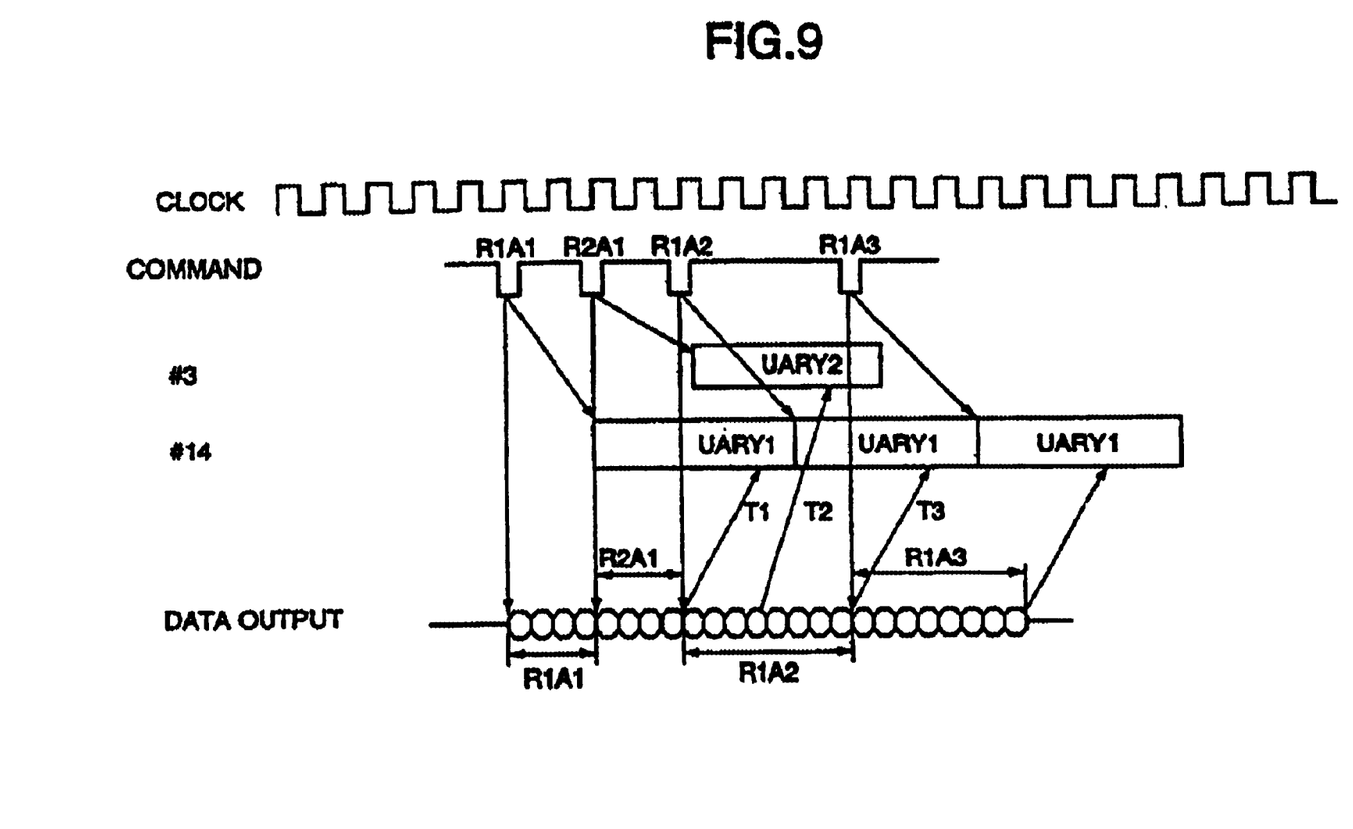
FIG. 9 is a timing chart showing a burst write operation of the SDRAM shown in FIG. 1.

As in the case of the burst read shown in FIG. 7, the commands R1A1, R2A1, R1A2 and R1A3 are issued at the same timings also for the burst write shown in FIG. 9. For the burst write, however, the input of burst data is started upon the issuance of the commands.

Since the command R2A1 is issued two clock cycles following the command R1A1, the first four bits of data are written in response to the command R1A1, whereas the latter four bits of data are not written to the array. Instead, the first four bits of data are written in response to the command R2A1. Since the command R1A2 is issued two clock cycles following the command R2A1, the first four bits of data are written in response to the command R2A1, whereas the latter four bits of data are not written to the array. Instead, the first four bits of data are written in response to the command R1A2. The command R1A3 is issued four clock cycles following the command R1A2, so that all eight bits of data are written in response to the command R1A2.

When the command R1A1 is issued, the segment array #14 is selected, as in the burst read operation described above, and the UARY1 in the segment array #14 is selected. Unlike the burst read operation, however, the write enable signal is asserted to a logic high and the PLL is activated. Hence, the first four bits of data written in response to the command R1A1 and the first four bits of data written in response to the command R2A1 are transmitted by two bits at a time via a corresponding write data bus WDB and latched by a corresponding PLL.

The 8-bit data latched by the PLL is transmitted to the unit array UARY1 at a timing T1 through eight corresponding GDL pairs. In this case, however, the next command is issued in two clock cycles, so that the masking signals MSK0 and MSK1 are set to a logic high, while the masking signals MSK2 and MSK3 are set to a logic low. Therefore, of the transmitted eight bits of data, the first four bits of data are written to UARY1, whereas the latter four bits of data are masked by the column address mask circuit 14 and not written to UARY1.

Since the command R2A1 is issued in two clock cycles following the command R1A1, the segment array #3 is selected, and UARY2 in the segment array #3 is selected. Therefore, the first four bits of data written in response to the command R2A1 are latched also by the PLL corresponding to the segment array #3. Since the command R1A2 is issued two clock cycles following the command R2A1, the first four bits of data written in response to the command R1A2 are latched also by the PLL. The 8-bit data latched by the PLL circuit is transmitted to UARY2 at a timing T2 through eight corresponding GDL pairs. Only the first four bits of data input based on the command R2A1 are written to the unit array UARY2, whereas the latter four bits of data are masked and not written to UARY2. The latter four bits of data are written to UARY1 of the segment array #14 at a timing T3 to be discussed hereinafter.

No interrupt takes place during the burst write operation based on the command R1A2, so that all eight bits of data written in response to the command R1A2 are written to the UARY1 of the segment array #14 at the timing T3.

As described above, according to the first embodiment of the present invention, since the segment arrays #0 through #15 are activated independently from each other, a burst operation of a particular UARY 20 in a particular segment array is interrupted, and a burst operation of an arbitrary unit array in another segment array already activated is immediately initiated. Hence, seamless input/output of burst data is possible. In this first embodiment, the probability of the occurrence of such valid interrupts is 93.75% (=15÷16), which is a dramatic improvement over the conventional probability 0.012%.

In the foregoing first embodiment, a burst interrupt between segment arrays is presented, but a burst interrupt between unit arrays in the same segment array is difficult to achieve. However, the probability for the occurrence of valid interrupts can be further increased by making it possible to ensure independent burst operations not only for the segment arrays but for unit arrays also.

Figure 10:
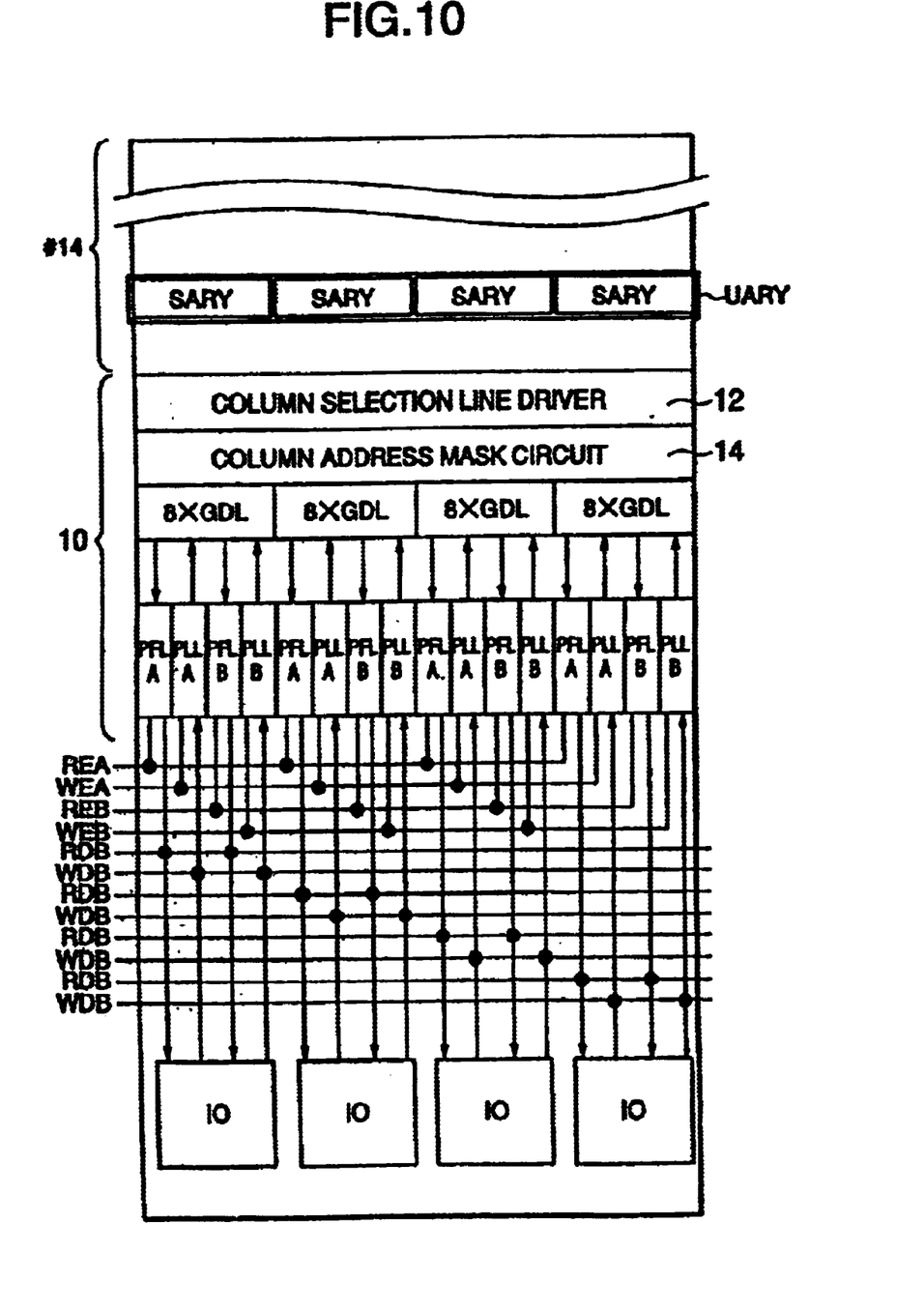
FIG. 10 is a functional block diagram showing the configurations of segment arrays, a segment control circuit and its neighborhood in an SDRAM according to a second embodiment of the present invention.

Specifically, the four prefetch latch circuits and the four preload latch circuits are provided for each segment array in the first embodiment, whereas eight prefetch latch circuits (PFLA0-3, PFLB0-3) and eight preload latch circuits (PLLA0-3, PLLB0-3) are provided in the second embodiment, as shown in FIG. 10. In other words, two prefetch latch circuits (PFLA, PFLB) and two preload latch circuits (PLLA, PLLB) are provided for each SARY.

Furthermore, to actuate only the bit switch CSG in the UARY 20 selected by a unit array selector circuit 18, a column selection (CS) signal is activated in that particular unit array. More specifically, another transfer gate is connected in series to each bit switch CSG, and the transfer gate is turned ON/OFF in response to a unit array enable signal corresponding to each UARY.

According to the second embodiment, the two prefetch latch circuits PFLA, PFLB and the two preload latch circuits PLLA, PLLB are provided for each SARY, thus allowing two interrupts to take place during an 8-bit burst operation. In a burst read operation, 8-bit burst data before a first interrupt is latched by the prefetch latch circuit PFLA, and 8-bit burst data before a second interrupt is latched by the prefetch latch circuit PFLB. Meanwhile, in a burst write operation, 8-bit burst data before a first interrupt is latched by the preload latch circuit PLLA, and 8-bit burst data before a second interrupt is latched by the preload latch circuit PLLB.

Since each UARY 20 independently performs burst operations, burst interrupts can be accepted not only between segment arrays but between unit arrays in the same segment array. Specifically, a burst interrupt is not realizable in only one UARY 20 currently in a burst operation among 256 (=16×16) unit arrays UARYs 20, meaning the remaining 255 unit arrays accept burst interrupts. Thus, the probability of valid interrupts is 99.6% (=255÷256), which is higher than that in the first embodiment.

In a second embodiment, the two prefetch latch circuits PFLA, PFLB and the two preload latch circuits PLLA and PLLB are provided. To allow up to four interrupts by two bist during an 8-bit burst operation, four prefetch latch circuits and four preload latch circuits may be provided.

The present invention is not limited to the DDR-SDRAM, but is also applicable to a standar SDR (Single Data Rate) type SDRAM, an asynchronous DRAM or SRAM (Static Random Access Memory), or a ROM (Read Only Memory).

The embodiments in accordance with the present invention have been describe above; however, the disclosed embodiments are mere illustrations for embodying the present invention. The invention, therefore, is intended to cover various modifications and equivalent arrangements of the aforesaid embodiments included within the spirit and scope of the invention.

What is claimed is:

1. A semiconductor storage device comprising:
    a plurality of arrays activated independently from each other;
    a plurality of burst read circuits provided in correspondence to the plurality of arrays, each burst read circuit successively reading a plurality of bits of data from a corresponding array; and
    a burst interrupt circuit for activating a first burst read circuit while a second burst read circuit is activated.

2. The semiconductor storage device according to claim 1, further comprising:
    a plurality of burst write circuits provided in correspondence to the plurality of arrays, each burst write circuit successively writing a plurality of bits of data in a corresponding array; and
    a burst interrupt circuit for activating a first burst write circuit while a second burst write circuit is activated.

3. A semiconductor storage device comprising:
    a plurality of segment arrays, each including a plurality of unit arrays;
    a plurality of segment selector circuits provided in correspondence to the plurality of segment arrays, each segment selector circuit activating a corresponding segment array;
    a plurality of unit array selector circuits provided in correspondence to the plurality of segment arrays, each unit array selector circuit selectively activating the plurality of unit arrays included in a corresponding segment array;
    a plurality of burst read circuits provided in correspondence to the plurality of segment arrays, each burst read circuit successively reading a plurality of bits of data from a unit array activated by the unit array selector circuit from among the plurality of unit arrays included in a corresponding segment array; and
    a burst interrupt circuit for activating a first burst read circuit while a second burst read circuit is activated.

4. The semiconductor storage device according to claim 3, wherein each of the burst read circuits includes a first prefetch latch circuit that is activated in response to a first read enable signal, and latches a plurality of bits of data read from a unit array activated by the unit array selector circuit; and
    the burst interrupt circuit activates the first read enable signal for the first prefetch latch circuit that corresponds to a segment array activated by the segment selector circuit.

5. The semiconductor storage device according to claim 4, wherein each of the burst read circuits further comprises:
    a second prefetch latch circuit activated in response to a second read enable signal to latch a plurality of bits of data read from another unit array activated by the unit array selector circuit; and
    the burst interrupt circuit activates the second read enable signal for the second prefetch latch circuit that corresponds to a segment array activated by the segment selector circuit.

6. The semiconductor storage device according to claim 3, further comprising:
    a plurality of burst write circuits provided in correspondence to the plurality of segment arrays, each successively writing a plurality of bits of data in its corresponding segment array.

7. The semiconductor storage device according to claim 6, wherein each of the burst write circuits includes a first preload latch circuit activated in response to a first write enable signal so as to latch a plurality of bits of data to be written to a first unit array activated by the unit array selector circuit, and the burst interrupt circuit activates the first write enable signal for the first preload latch circuit corresponding to a segment array activated by the segment selector circuit.

8. The semiconductor storage device according to claim 7, wherein each of the burst write circuits further includes a masking device for partly masking a plurality of bits of data latched in the first preload latch circuit.

9. The semiconductor storage device according to claim 8, wherein each of the burst write circuits further includes a second preload latch circuit activated in response to a second write enable signal to latch a plurality of bits of data to be written to a second unit array activated by the unit array selector circuit, and the burst interrupt circuit activates the second write enable signal for the second preload latch circuit corresponding to a segment array activated by the segment selector circuit.

* * * * *